US007079369B2

(12) United States Patent
Hulfachor et al.

(10) Patent No.: US 7,079,369 B2
(45) Date of Patent: Jul. 18, 2006

(54) ACTIVE POWER/GROUND ESD TRIGGER

(75) Inventors: Ronald B. Hulfachor, Nashua, NH (US); Jay R. Chapin, South Portland, ME (US)

(73) Assignee: Fairchild Semiconductor Corporation, South Portland, ME (US)

( * ) Notice: Subject to any disclaimer, the term of this patent is extended or adjusted under 35 U.S.C. 154(b) by 148 days.

(21) Appl. No.: 10/207,625

(22) Filed: Jul. 29, 2002

(65) Prior Publication Data

US 2003/0026054 A1    Feb. 6, 2003

Related U.S. Application Data

(60) Provisional application No. 60/309,726, filed on Aug. 2, 2001.

(51) Int. Cl.
*H02H 9/00* (2006.01)
(52) U.S. Cl. .................................. 361/111; 361/56
(58) Field of Classification Search ............. 361/56, 361/57, 58, 91.1, 111, 91; 257/355–360
See application file for complete search history.

(56) References Cited

U.S. PATENT DOCUMENTS

| | | | | |
|---|---|---|---|---|
| 5,450,267 A | * | 9/1995 | Diaz et al. | 361/56 |
| 5,744,842 A | * | 4/1998 | Ker | 257/362 |
| 5,754,380 A | | 5/1998 | Ker et al. | |
| 5,838,146 A | * | 11/1998 | Singer | 323/270 |
| 5,946,177 A | | 8/1999 | Miller et al. | |
| 5,959,488 A | | 9/1999 | Lin et al. | |
| 5,982,600 A | * | 11/1999 | Cheng | 361/111 |
| 6,069,782 A | * | 5/2000 | Lien et al. | 361/111 |
| 6,072,682 A | * | 6/2000 | Ravanelli et al. | 361/111 |
| 6,125,021 A | | 9/2000 | Duvvury et al. | |
| 6,249,410 B1 | * | 6/2001 | Ker et al. | 361/56 |
| 6,424,510 B1 | * | 7/2002 | Ajit et al. | 361/59 |

OTHER PUBLICATIONS

PCT International Search Report for the corresponding PCT application.

* cited by examiner

*Primary Examiner*—Brian Sircus
*Assistant Examiner*—Danny Nguyen
(74) *Attorney, Agent, or Firm*—Cesari and McKenna LLP; Edwin H. Paul, Esq.

(57) ABSTRACT

An ESD protective triggering circuit for a triggering circuit for a solid state ESD protective device. The arrangement is to provide a controlled current to the protective device that triggers the device so that the device snaps-back and additionally the triggering device enables the parasitic transistor to participate in the draining of the ESD current. The triggering circuit also terminates the current to the protective device when the ESD voltage starts to fall. The triggering circuit can be used in any computer controlled electronics system.

6 Claims, 3 Drawing Sheets

ACTIVE POWER/GROUND ESD TRIGGER

CROSS-REFERENCE TO RELATED APPLICATIONS

The present application claims the benefit of U.S. Provisional Patent Application Ser. No. 60/309,726, which was filed on Aug. 2, 2001, of common title, inventorship and ownership with the present application and is hereby incorporated herein by reference.

FIELD OF THE INVENTION

The present invention relates to electro-static discharge (ESD) protection circuits for integrated circuits, and more particularly to trigger circuitry for a solid state ESD MOS protection device.

BACKGROUND INFORMATION

As integrated circuits (ICs), especially CMOS circuits, are reduced in size into the sub-micron range with ever thinner oxide layers, shallower junctions, more lightly doped structures, and silicided diffusions, the structures become ever more susceptible to ESD induced failures. Human or mechanical handling produce static charges that can and do cause destructive failure in such ICs. At most risk to such failure are those components that are electrically connected to terminals or pads leading off the printed circuit board carrying the components. Active devices are usually more prone to ESD failures. So the gates, the drains, the source (and the bases, collectors and emitters) of a CMOS (complementary metal over silicon) buffer, and the drains, sources, and gates of such devices that are electrically connected to power and ground rails are most susceptible.

Generally, ESD events produce voltages that permanently damage thin oxide insulting layers and/or uneven current densities that damage junctions and/or diffusion profiles in small areas. These mechanisms have been well documented in the art. For example, see "Achieving Uniform NMOS Device Power Distribution for Sub-micron ESD Reliability," by C Duvvury and C. Diaz, and T. Haddock, in IEDM *Technical Digest,* 1992.

Prior art ESD protect circuits include series resistors, filter capacitors, and Zener or other such breakdown devices employed at the terminals to limit the effect of the ESD event. These protection techniques are designed, inter alia, with marginal success to trigger at ESD voltages higher than the typical operating voltages of the product itself so that the ESD protection does not interfere with the typical product functional operation.

It is well known in the art to apply NMOS devices, herein called ESD NMOS, to provide circuit characteristics that protect functional circuitry from ESD failures. Since the protection mechanism is well known, only a brief outline of the protection follows.

ESD NMOS devices demonstrate a latching type of breakdown, sometimes referred to as "snap-back," due to the negative resistance characteristic of the current versus voltage curve of the device. A strong electric field across the depletion zone in the drain substrate will cause it to avalanche. This forward biases the source junction and the NMOS snaps-back to a low impedance drain to source to conduct the ESD current and limit the ESD voltage. Lateral bipolar transistors (that may exist as parasitic transistors, see item 30 FIG. 1), in parallel with the ESD device, may help in the ESD protection. Circuits employing these devices often have resistor/capcitor (RC) circuits that are used to trigger the ESD device. For example, see U.S. Pat. No. 5,959,488 invented by Shi-Tron Lin.

In particular, ESD events on the power (Vcc) and/or ground (gnd) have been a continuing problem. In particular, since the power rail can have a wide range of capacitance connected to it, due to the many different circuit families and applications, the ESD signal edges may be quite different in the different conditions and these differences will compromise the effects of fixed RC trigger circuits. Designing one RC to accommodate the wide variety of environments would require too much chip space—it is inefficient. Zeners and other such avalanche break down devices suffer from process variations and can leak or improperly breakdown and interfere with typical product operations.

The present invention provides a trigger circuit that: is efficient in chip space; is effective with the wide variety of capacitances and other such environmental conditions; is applicable to ESD NMOS or NPN transistors; can be designed with low and programmable (adjustable) trigger voltages that protect the product circuits; and can be designed to not interfere with the normal product function over the specified environmental conditions for the product.

SUMMARY OF THE INVENTION

The objects and advantages above and other advantages are achieved by a triggering circuit for protective active device protecting against an ESD high voltage appearing on the power (Vcc) rail with respect to the ground rail. The protective active device defines a control node. In a preferred example, the protective active device is a NMOS FET and the control node is its gate. A second active device defining a second control node is coupled between Vcc and the control node and is biased so that when the ESD voltage occurs this second active device turns on supplying a controlled current to the control node. When triggered, the protective device demonstrates a negative impedance or snap-back that limits the ESD voltage excursion to acceptable levels.

The biasing for the second active device supplies a controlled current to the control node that is enough to trigger the protective device and also bias on the parasitic transistor that parallels the protective device so that the parasitic device aids in limiting the ESD voltage. As is known in the art, ESD buried layers may be used that affect the gate charge of FET's and the base drive of the parasitic transistors. Knowing the parameters of the specific requirements, practitioners can design triggering circuits that will protect the circuitry utilizing both the snap-back of the protective device, and the parasitic transistor. In a preferred embodiment, when the protective device is an NMOS FET the parasitic transistor is an NPN type.

There is a capacitor connected to the second control node, wherein when the ESD voltage relaxes, the second active device turns off terminating current to the protective device control node.

The design of the controlled current to the protective device and the biasing of the second active device is such that the normal operation of the circuit is unaffected. This means that the entire frequency range, the expected operating power and the signal voltages will not be affected.

Since ESD protection is needed in virtually all computer related electronics systems, the present invention will find advantageous application in displays, memories, communications, client/server and any other computing or electronic system.

BRIEF DESCRIPTION OF THE DRAWINGS

The invention description below refers to the accompanying drawings, of which.

DETAILED DESCRIPTION OF ILLUSTRATIVE EMBODIMENTS

Figure 1A:
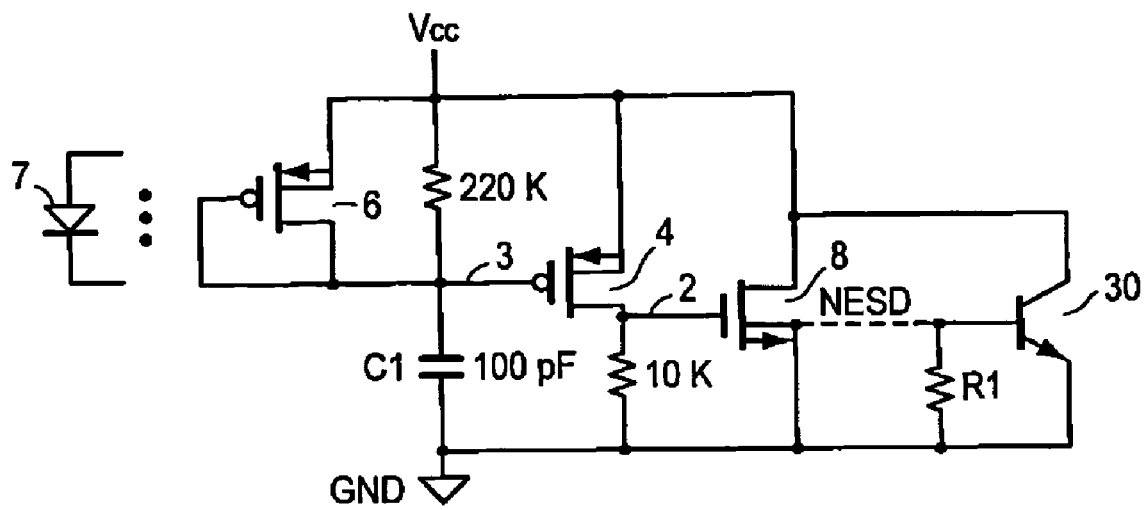
FIG. 1A is a circuit diagram incorporating the inventive trigger circuit.

FIG. 1A shows a ESD NMOS (NESD) device 8 with its drain to Vcc and its source to ground. Of course, the NESD device may be situated between any two power rails of unequal voltages. The circuit in FIG. 1A will protect when the difference between Vcc and gnd experiences a rising ESD voltage. There is a parasitic NPN bipolar transistor 30 typically found paralleling the NESD device, that may participate in the protection. In practice the connecting etched runs for the power and gnd signals should be short and wide, within the confines of the specific design, to minimize the inductive and resistive drops across the metal runs. Excessive drops across the runs will impress that voltage drop across some of the circuitry being protected, thereby reducing the effectiveness of the protection MOS device.

The circuit of FIG. 1A includes a 10 K ohm resistor from the drain of PMOS 4 to ground and the 220 K ohm resistor paralleling the PMOS connected diode 6, with the diode representation shown as item 7, between Vcc and the gate of PMOS 4. It is well known in the art that the sizes of the active and passive components shown in FIG. 1A, as well as other active and passive components (not shown), may be designed to provide substantially the same operating characteristics. For example, PMOS 6 is a small device wherein the channel resistance may be relatively large so that the equivalent diode drop across this device may have a significant resistive component. The resistive component may be an actual resistor rather than a small device. Such design tradeoffs are well known in the field. Herein the term "coupled" means directly connected or connected through another component, but where that added component supports the circuit function.

The ESD NMOS gate 2 connects to the drain of the PMOS 4 with a 10 K resistor to gnd. The source of the PMOS driver 4 connects to the Vcc rail, and the gate connects to a 220 K ohm resistor to Vcc and a 100 pico farad C1 capacitor to gnd. There is another PMOS 6 connected as a diode from Vcc to the gate of PMOS driver 4, across the 220 K ohm resistor.

When an ESD voltage appears at the Vcc rail referenced to gnd, the gate of the PMOS drive 4 is held to about a volt below the Vcc by the diode connected PMOS 6, but as modified by the action of the capacitor C1. The designs of the capacitor C1 and the PMOS 6 allows the PMOS 4 to turn on where ESD current charges the gate of the NESD 8, thereby triggering the NESD. The NESD snaps-back and limits the ESD voltage excursions on the Vcc rail to a specified level. The diode connected PMOS 6 limits the PMOS 4 gate voltage and so controls the gate voltage of the NESD. This controlling of the NESD gate voltage, as is known in the art, is designed to drive the NESD to snap back, but also so that the parasitic NPN transistor 30 remains effective to limit the ESD voltage. The triggering level of the NESD 8 may also be controlled by the ESD implants (buried layers) affecting the gate charge and the base drive to an NPN transistor, as is well known in the art, to also make the NPN effective to limit the ESD voltage.

Once the energy from the ESD event subsides, the capacitor C1 will be charged so that when the ESD voltage relaxes or falls the gate of the PMOS driver 4 is higher that Vcc thereby shutting off the PMOS driver 4 and thus the ESD NMOS.

Figure 4:
FIG. 4 is a layout of one half of a PMOS trigger arranged on each side of the NESD.

When the present active trigger is physically laid out, the PMOS driver 4 and the PMOS diode 6 are arranged with half of each on each side of the NESD which balances and equalizes the operation of the NESD, and Multiple NESD's can be used on a chip to reduce the troubling effects of bus resistance and current sharing paths on ESD protection. FIG. 4 shows half of the PMOS trigger circuit on each side of the NESD.

Figure 1B:
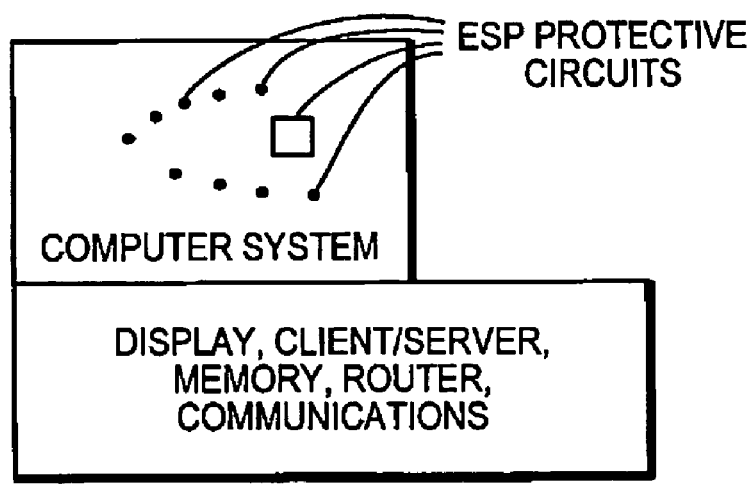
FIG. 1B illustrates the inventive circuit in computer systems.

FIG. 1B illustrates the inventive circuit, as applied to the electronics assemblies and circuitry of any computing system. In fact, the ESD protection provided by the present invention may be found in the power supplies, the computing and processing electronics and in each electronics assembly found in all the electronics associated with the I/O of each assembly. So the printer, the display, the memory, the motor drivers, power supplies, etc., all will benefit from the present invention.

Figure 2:
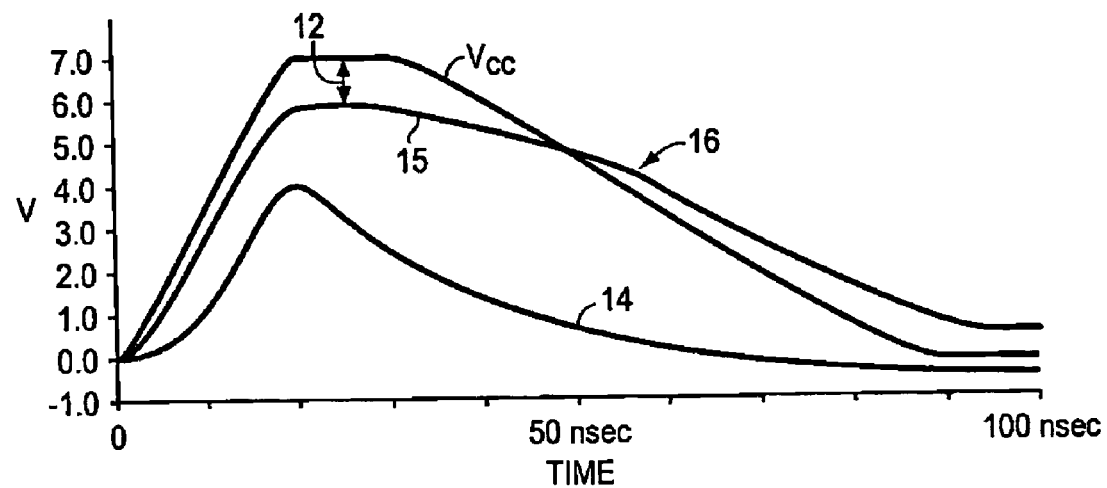
FIG. 2 is a transient response chart for the trigger circuit.
Figure 3:
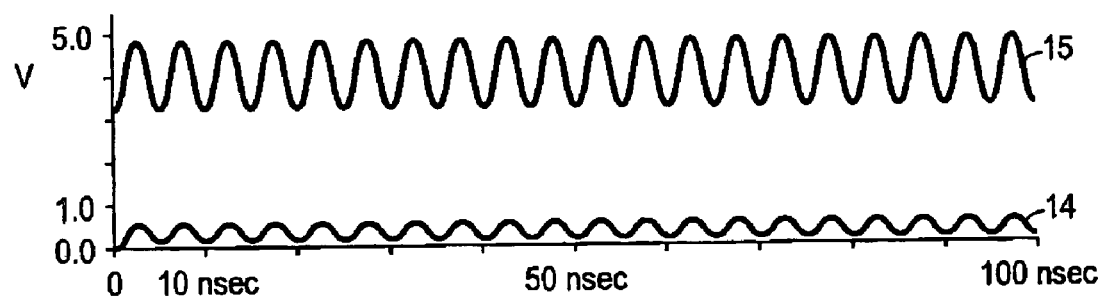
FIG. 3 is a chart showing the benign nature of the trigger with no ESD events occurring.

FIG. 2 shows voltage/time profiles of points on the circuit of FIG. 1A. Here there is a seven volt rise on the Vcc rail compared to gnd (or Vss) rail. The voltage rises in about 20 nsec. The pull up gate 3 voltage 15 of PMOS 4 via the diode connected PMOS 6 (from FIG. 1A) trails the Vcc rise by about a diode drop 12 (about a volt in practice) thereby limiting or moderating the drive to the NESD gate 2. The NESD gate 2 voltage 14 rises and snaps-back to absorb the ESD current and limit the ESD voltage swing. During the relaxation of the ESD event, the pull-up PMOS gate voltage 15 remains above 16 the Vcc declining voltage by about 1 volt due to the charge on the capacitor C1 holding the gate 3 high and the inherent diode voltage drop with its anode drain to the cathode body of PMOS 6. This ensures that the PMOS 4 is off and so the NESD is shut down after the ESD event. FIG. 3 shows that the NESD NMOS gate 3 voltage 14 holds the ESD NMOS off and non-interfering during an Fmax operation illustrated by the pullup PMOS gate voltage 15 (and thus during any other "normal" operation) of the functional circuit. Fmax is a standard transistor parameter, and the maximum signal transferred to the NESD gate via the intrinsic capacitors would occur at Fmax in normal operations. FIG. 3 shows that at Fmax the NESD gate remains low thereby allowing normal circuit operation.

The active nature of the PMOS devices 4 and 6 reduce the effect of different possible capacitances on the Vcc rail. The Active PMOS devices will provide nearly the same timing and protective level with wide variations in the capacitances connected to the Vcc rail. FIG. 4 shows one half of a PMOS trigger 22 arranged on each side of the NESD 24.

The inventive trigger works with the parasitic NPN transistor and therefore will work with a design-in protective NPN transistor, and the inventive trigger can be modified, as is well known, to work with PMOS protective devices (or p-types in general) rather than the ESD NMOS (or n-types in general).

What is claimed is:

1. An electronic computer controlled system selected from the group consisting of communication, networking, routing, or server/client systems having computer processing electronics, keyboard and display, memory, input/output controllers and devices, the electronic computer controlled system further comprising:
   a power supply providing power to a power rail with respect to a ground rail, and where an ESD voltage appears as an increasing or decreasing voltage between the power and ground rails,
   electronic circuits powered from the power and ground rails,
   a first active ESD protective device disposed between the power and the ground rails that limits the ESD voltage, the active ESD device having a first control node,
   a second active device having a second control node,
   a third active device functionally connected between the second control node and the power rail,
   a capacitor functionally connected between the second control node and the ground rail,
   wherein, when a positive ESD voltage appears on the power rail, capacitor voltage trails the ESD voltage by an amount wherein the second active device turns on and drives the first active device into a snap-back condition and turns on a parasitic bipolar transistor within the first ESD active device, wherein the first ESD active device limits the ESD voltage on the power rail, and wherein the rising ESD voltage also turns on the third active device to start charging the capacitor such that the voltage on the capacitor rises and turns off the second active device after a designed time delay, and that discharges the capacitor when the ESD voltage is falling.

2. The electronic computer controlled system of claim 1 wherein the third active device is a diode connected solid state device and the second active device is a PMOS transistor.

3. An ESD protective circuit connected between a power rail and a ground, the ESD protective circuit comprising:
   a first ESD active device disposed between the power and the ground rails the first ESD active device having a first control node,
   a second active device disposed between the power rail and the first control node, the second active device having a second control node,
   a third active device functionally connected between the second control node and the power rail,
   a capacitor functionally connected between the second control node and the ground rail,
   wherein, when a positive ESD voltage appears on the power rail, capacitor voltage trails the ESD voltage by an amount wherein the second active device turns on and drives the first ESD active device into a snap-back condition and turns on a parasitic bipolar transistor within the first ESD active device, wherein the first ESD active device limits the ESD voltage on the power rail, and wherein the rising ESD voltage also turns on the third active device to start charging the capacitor such that the voltage on the capacitor rises and turns off the second active device after a designed time delay, and that discharges the capacitor when the ESD voltage is falling.

4. The ESD protective circuit as defined in claim 3 wherein the third active device comprises a diode connected solid state device with its anode coupled to the power rail and its cathode coupled to the second control node.

5. The ESD protective circuit as defined in claim 3 wherein the third active device comprises:
   a diode connected PMOS transistor.

6. The ESD protective circuit as defined in claim 3 wherein the second active device comprises a PMOS transistor.

* * * * *